(12) United States Patent
Eguchi

(10) Patent No.: US 6,909,487 B2
(45) Date of Patent: Jun. 21, 2005

(54) ELECTRO-OPTICAL DEVICE AND SEMICONDUCTOR DEVICE

(75) Inventor: Tsukasa Eguchi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/442,049

(22) Filed: May 21, 2003

(65) Prior Publication Data

US 2004/0041152 A1 Mar. 4, 2004

(30) Foreign Application Priority Data

| May 22, 2002 | (JP) | ................................. | 2002-148222 |
| May 9, 2003 | (JP) | ................................. | 2003-131673 |

(51) Int. Cl.[7] ............................................ G02F 1/1343
(52) U.S. Cl. .................................... 349/139; 257/621
(58) Field of Search ........................... 257/21, 54, 91, 257/99, 79, 80, 82, 85, 86, 89, 59, 72, 347, 751, 752, 762; 349/147, 148, 149, 150, 151, 139, 142

(56) References Cited

U.S. PATENT DOCUMENTS

2002/0070457 A1 * 6/2002 Sun et al.

FOREIGN PATENT DOCUMENTS

| JP | A 63-143845 | 6/1988 |
| JP | A 7-106416 | 4/1995 |
| JP | A-7-326666 | 12/1995 |
| JP | A 10-79426 | 3/1998 |
| JP | A 10-163315 | 6/1998 |
| JP | A 10-340953 | 12/1998 |
| JP | 11-202368 | 7/1999 |
| JP | A-2000-357735 | 12/2000 |
| JP | 2001-185617 | 7/2001 |
| JP | A 2002-40962 | 2/2002 |

* cited by examiner

Primary Examiner—Hoai Pham
Assistant Examiner—Dana Farahani
(74) Attorney, Agent, or Firm—Oliff & Berridge, PLC

(57) ABSTRACT

In order to provide an electro-optical device and a semiconductor device each having a connecting portion with a structure capable of reducing or preventing reliability from deteriorating and allowing circuits to be highly integrated, a connecting portion a first conductive layer formed on a first insulating film, a second insulating film formed to cover the first conductive layer, a second conductive layer formed on the second insulating film and a contact hole penetrating the second insulating film and the first insulating film. Wiring lines are electrically connected to each other because the first conductive layer contacts the second conductive layer on the side surface of the contact hole. Further, an etching stop layer that has a tolerance against etching of the first insulating film is disposed on a region corresponding to at least the bottom surface of the contact hole.

8 Claims, 6 Drawing Sheets

(a)

(b)

(a)

(b)

(a)

(Related Art)

(b)

(Related Art)

ELECTRO-OPTICAL DEVICE AND SEMICONDUCTOR DEVICE

BACKGROUND OF THE INVENTION

1. Field of the Invention

The present invention relates to an electro-optical device and a semiconductor device, and more particularly, to the structure of a connecting portion including a contact hole used for an electro-optical device or a semiconductor device.

2. Description of Related Art

In an electro-optical device, such as a display device, provided with a liquid crystal display device or EL (electroluminescence) elements, or in a semiconductor device, a plurality of elements such as transistors and diodes forming, for example, a predetermined circuit and a plurality of wiring lines to connect these elements to each other are formed on a substrate. Such wiring lines mainly adopt a structure where the wiring lines formed of two conductive layers disposed on and under an insulating film are connected to each other through a contact hole (for example, Japanese Unexamined Patent Application Publication No. 7-326666). The related art structure of such a connecting portion is illustrated in FIGS. 6(a) and 6(b).

As illustrated in FIG. 6(a), in a connecting portion 60, a horizontally extending first wiring line 61 is connected to a vertically extending second wiring line 62 through a contact hole 63, disposed in a portion where the first wiring line 61 crosses the second wiring line 62. Further, a wiring line 64 extending substantially parallel to the second wiring line 62 on the right side of the connecting portion 60 is an adjacent wiring line formed in the same layer as the first wiring line.

FIG. 6(b) is a cross-sectional view taken along the plane A-A' of FIG. 6(a). As illustrated in FIG. 6(b), a first insulating film 66 and a second insulating film 67 are sequentially laminated on a substrate 65. The first wiring line 61 is formed on the second insulating film 67. A third insulating film 68 is formed on the second insulating film 67 to cover the first wiring line 61. Further, the contact hole 63, that penetrates the third insulating film 68 and reaches the surface of the first wiring line 61, is formed above the first wiring line 61. The second wiring line 62 is formed in the contact hole 63 to contact the first wiring line 61 on the bottom surface of the contact hole 63. As a result, the wiring lines 61 and 62 are electrically connected to each other.

In the related art two-dimensional structure of FIG. 6(a), the end of the first wiring line 61 and the edge of the second wiring line 62 coincide in plan view. Therefore, in consideration of the design rule determined by the photolithography technology used or, by the exposure apparatus used, when the minimum space between patterns formed in the same layer is referred to as S, the gap between the end of the first wiring line 61 and the edge of the adjacent wiring line 64 is S. The gap between the edge of the second wiring line 62 and the edge of the adjacent wiring line 64 is also S. Therefore, it is not possible to further narrow the gap between the edge of the second wiring line 62 and the edge of the adjacent wiring line 64, which extend in parallel with each other. In an electronic device such as a liquid crystal display device and a semiconductor device, it is necessary that the elements be minute and highly integrated. Such a requirement cannot be met by the above-described structure of the connecting portion.

For example, in a liquid crystal display device in which a peripheral circuit is included, in an input and output wiring portion to sample a video signal, as the number of bits increases, the number of video signal lines extending in parallel with each other increases. The number of contact holes between a second conductive layer and the video signal lines significantly increases. Accordingly, the area occupied by the input and output wiring portion increases.

SUMMARY OF THE INVENTION

Accordingly, it is an object of the present invention to provide an electro-optical device, and a semiconductor device each having a connecting portion with a structure capable of coping with minute and highly integrated elements in order to reduce or solve the problem described above.

To achieve the above object, an electro-optical device including an electro-optical material, includes: on a substrate, a first insulating layer, a first conductive layer formed on the first insulating layer, a second insulating layer formed to cover the first conductive layer, a second conductive layer formed on the second insulating layer, and a contact hole at least penetrating the second insulating layer, a connecting portion where the first conductive layer and the second conductive layer are electrically connected to each other because the first conductive layer contacts the second conductive layer in part of the side surface or the bottom surface of the contact hole. An etching stop layer that has a tolerance against etching of the first insulating layer is disposed at least in a region under the bottom surface of the contact hole.

The electro-optical device according to the present invention includes the connecting portion where the first conductive layer and the second conductive layer are electrically connected to each other because the first conductive layer contacts the second conductive layer in part of the side surface or the bottom surface of the contact hole. Therefore, according to this structure, the circuit of the electro-optical device can be highly integrated because it is possible to densely arrange an adjacent pattern formed of the first conductive layer and the second conductive layer.

However, if, during the etching of an insulating layer in a process of forming the contact hole, another insulating layer is exposed to the bottom surface of the contact hole, the etching may proceed too deep. In such a case, the coverage of the second conductive layer formed along the internal wall surface of the contact hole deteriorates to cause disconnection, which deteriorates reliability. However, according to the present invention, an etching stop layer that has a tolerance against etching of the first insulating layer is disposed at least in a region under the bottom surface of the contact hole. Therefore, although the second insulating layer and the first insulating layer are sequentially etched, the etching stops at the point in time where the etchant reaches the etching stop layer and does not proceed further. Therefore, the contact bole does not deepen too much and the second conductive layer is reliably formed along the internal wall surface of the contact hole. As a result, it is possible to reduce or prevent the reliability from deteriorating.

Either a conductive film or a semiconductor film can be used as a material to form the etching stop layer, as long as it is possible to provide a sufficiently large etching selection ratio in the etching of the first insulating layer. It is preferable to use a film that can be formed in a position corresponding to the bottom surface of the contact hole. For example, a conductive film or a semiconductor film forming a wiring line such as a scanning line in an electro-optical device of an active matrix method or elements such as transistors. In such a case, it is not necessary to perform a special process only to form the etching stop layer. Therefore, the manufacturing process does not need to be complicated. Further, the conductive film or the semiconductor film does not need to be created electrically by forming elements or wiring lines. It is preferable that the conductive film or the semiconductor film be electrically insulated from other elements or wiring lines.

Further, two dimensionally, it is preferable that the pattern of the contact hole protrude outward from the pattern of the first conductive layer and that the other pattern in the same layer as the first conductive layer be arranged at the side where the pattern of the contact hole protrudes.

According to such a structure, even though the design rule of the first conductive layer does not change, it is possible to densely arrange the adjacent pattern formed of, for example, the first conductive layer and the second conductive layer. As a result, the circuit of the electro-optical device can be highly integrated.

A semiconductor device according to this invention, includes: on a substrate, a first insulating layer, a first conductive layer formed on the first insulating layer, a second insulating layer formed to cover the first conductive layer, a second conductive layer formed on the second insulating layer, and a contact hole at least penetrating the second insulating layer, a connecting portion where the first conductive layer and the second conductive layer are electrically connected to each other because the first conductive layer contacts the second conductive layer in part of the side surface or the bottom surface of the contact hole. An etching stop layer that has a tolerance against etching of the first insulating layer is disposed at least in a region under the bottom surface of the contact hole.

The etching stop layer maybe formed of either a conductive film or a semiconductor film. The conductive film or the semiconductor film does not need to form elements or wiring lines to be electrically functioned and is preferably electrically insulated from other elements or wiring lines. Further, two dimensionally, it is preferable that the pattern of the contact hole protrude outward from the pattern of the first conductive layer and that the other pattern in the same layer as the first conductive layer be arranged at the side where the pattern of the contact hole protrudes.

In the semiconductor device according to the present invention, it is possible to obtain the same operation and effect as those of the electro-optical device according to the present invention. Thus, it is possible to realize a semiconductor device having a highly reliable connecting portion capable of allowing circuits to be highly integrated.

BRIEF DESCRIPTION OF THE DRAWINGS

FIG. 1(a) is a plan view of the connecting portion. FIG. 1(b) is a cross-sectional view taken along the plane C-C' of FIG. 1(a).

FIG. 2(a) is a plan view of the connecting portion. FIG. 2(b) is a cross-sectional view taken along the plane D-D' of FIG. 2(a).

FIG. 6(a) is a plan view of the connecting portion. FIG. 6(b) is a cross-sectional view taken along the plane A-A' of FIG. 6(a).

DETAILED DESCRIPTION OF PREFERRED EMBODIMENTS

First Exemplary Embodiment

A first exemplary embodiment of the present invention will now be described with reference to FIGS. 1(a) and 1(b).

Figure 1:
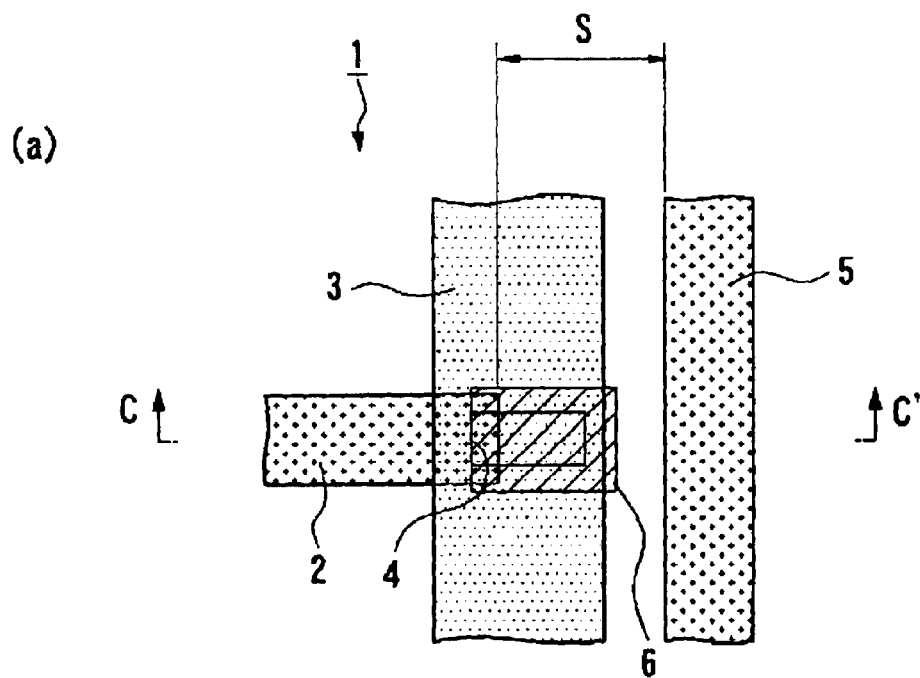
FIGS. 1(a) and 1(b) are views illustrating a connecting portion between wiring lines in a liquid crystal display device (an electro-optical device) according to a first exemplary embodiment of the present invention.
Figure 1:
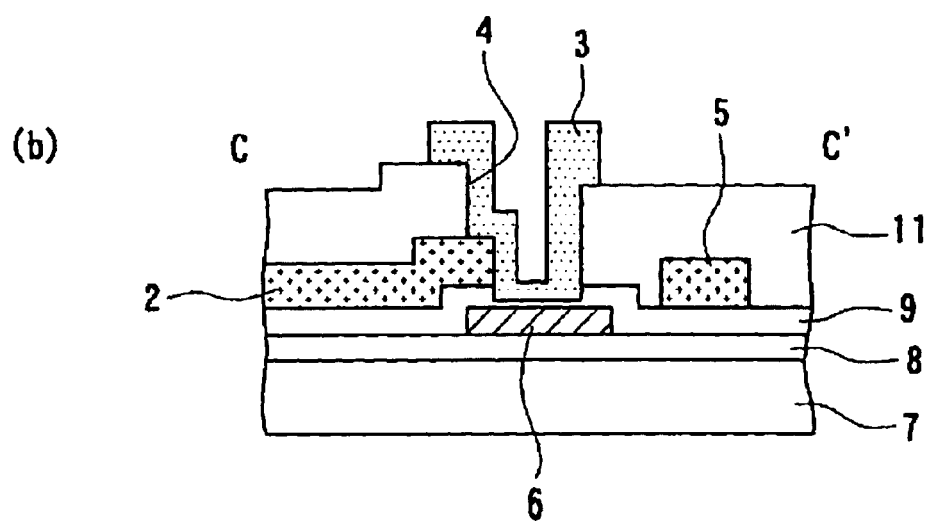

FIG. 1(a) is a plan view illustrating a connecting portion between the wiring lines in a liquid crystal display device (an electro-optical device) according to the present exemplary embodiment. FIG. 1(b) is a cross-sectional view taken along the plane C-C' of FIG. 1(a). The liquid crystal display device according to the present exemplary embodiment, in which a peripheral circuit is built, adopts an active matrix method. Liquid crystal is inserted between an element substrate and a counter substrate. A plurality of thin film transistors (referred to below as TFT) is formed on the element substrate. Conductive films such as a silicon layer, a first conductive layer, a second conductive layer, and a pixel electrode, which form the TFT, are sequentially formed on the substrate, with an insulating film therebetween.

In a connecting portion 1 according to the present exemplary embodiment, as two-dimensionally illustrated in FIG. 1(a), a horizontally extending first conductive layer 2 is connected to a vertically extending second conductive layer 3 through a contact hole 4, which is disposed in a portion where the first conductive layer crosses the second conductive layer. Further, a wiring line 5 extending substantially parallel to the second conductive layer 3, on the right side of the connecting portion 1, is the adjacent first conductive layer. The first conductive layer 2 does not completely cross the second conductive layer 3. The end of the first conductive layer 2 overlaps the second conductive layer 3 only partially in the direction of the width of the second conductive layer 3. The rectangular contact hole 4 is arranged in almost the middle in the direction of the width of the second conductive layer 3 to protrude toward the outside (the adjacent first conductive layer 5 side) of the end of the first conductive layer 2. The first conductive layer 2 overlaps part of the contact hole 4. Further, a rectangular etching stop layer 6 is disposed to surround the pattern of the contact hole 4.

Assuming a liquid crystal display device of the active matrix type, in which a peripheral circuit is included, in the peripheral circuit, the structure of the present invention is applied to a connecting portion between a wiring line and a wiring line or a connecting portion between a wiring line and an element. Here, as illustrated in FIG. 1(a), a case where only one second conductive layer 3 exists and is connected to only the first conductive layer 2 is provided as an example. However, the present invention is not restricted to a case where only one first conductive layer exists. The present invention can be applied to a case where a plurality of first conductive layers exist and each of them is connected to the second conductive layer.

In the sectional structure illustrated in FIG. 1(b), a base insulating film 8 and a first insulating film 9 are sequentially laminated on a substrate 7. The first conductive layer 2 is formed on the first insulating film 9. A second insulating film 11 is formed on the first insulating film 9 to cover the first conductive layer 2. Further, the contact hole 4, which completely penetrates the second insulating film 11, but does not completely penetrate the first insulating film 9, is formed. The bottom surface of the contact hole 9 is disposed in the middle in the film thickness direction of the first insulating film 9. Thus, the first insulating film 9 resides under the contact hole 4. Further, the end of the first conductive layer 2 is disposed in part of the side surface of the contact hole 4, the second conductive layer 3 is formed along the internal wall surface of the contact hole 4 and the second conductive layer 3 contacts the first conductive layer 2. Accordingly, the first conductive layer 2 and the second conductive layer 3 are electrically connected to each other. Further, the etching stop layer 6 is formed under the bottom surface of the contact hole 4 on the base insulating film 8. The etching stop layer 6 has a sufficiently large tolerance against etching of the first insulating film 9, because the etching selection ratio for the first insulating film 9 is high.

More specifically, as examples of configuration materials, a resin film such as a silicon oxide film, a silicon nitride film, and acryl is used as the base insulating film 8, the first insulating film 9, and second insulating film 11. A metal film such as Al, Ta, Ti, and Cr or a polycrystalline silicon film with conductivity, is used as the first conductive layer 2 and the second conductive layer 3. A semiconductor film, such as silicon or various films such as metal film, are used as the etching stop layer 6. According to the present exemplary embodiment, it is preferable to use a silicon film, formed of the same layer as the semiconductor layer forming the TFT, as the etching stop layer 6. According to the present exemplary embodiment, the silicon film used as the etching stop layer 6 is not integrated with the semiconductor layer of the TFT, but it is a separate pattern isolated from the semiconductor layer of the TFT. Therefore, the etching stop layer 6 is electrically floating.

When the connecting portion 1 having the above configuration is formed, after laminating the second insulating film 11 to cover the first conductive layer 2, the second insulating film 11 is etched using any suitable photolithography and etching technologies. Here, the end of the first conductive layer 2 is exposed to the side surface of the contact hole 4 to be formed. Next, part of the first insulating film 9 is etched in order to reliably connect the first insulating film to the second conductive layer 3, which is formed in the next process by further deepening the contact hole 4. In FIG. 1(b), only part of the first insulating film 9, in the film thickness direction is etched. But even if the first insulating film 9 in the film thickness direction is entirely etched, the etching would naturally stop when the etchant reaches the etching stop layer 6. Thereafter, when a conductive layer is formed and then patterned to form the second conductive layer 3, the connecting portion 1 according to the present exemplary embodiment is completed.

Further, when different kinds of materials are used for the first insulating film 9 and the second insulating film 11, it is possible to etch the insulating film in two steps, by changing the etchant. When the same kind of material is used for the first insulating film 9 and the second insulating film 11, the first insulating film 9 is also etched by over-etching the second insulating film 11, without changing the etchant. As a result, the state illustrated in FIG. 1(b) is obtained.

Further, even if the first insulating film and the second insulating film are formed of different kinds of materials, when the etching selection ratios of the first and second insulating films are small, it is easily assumed that the state illustrated in FIG. 1(b) is obtained without changing the etchant. The structure of the present exemplary embodiment is effective for such various cases.

Figure 6:
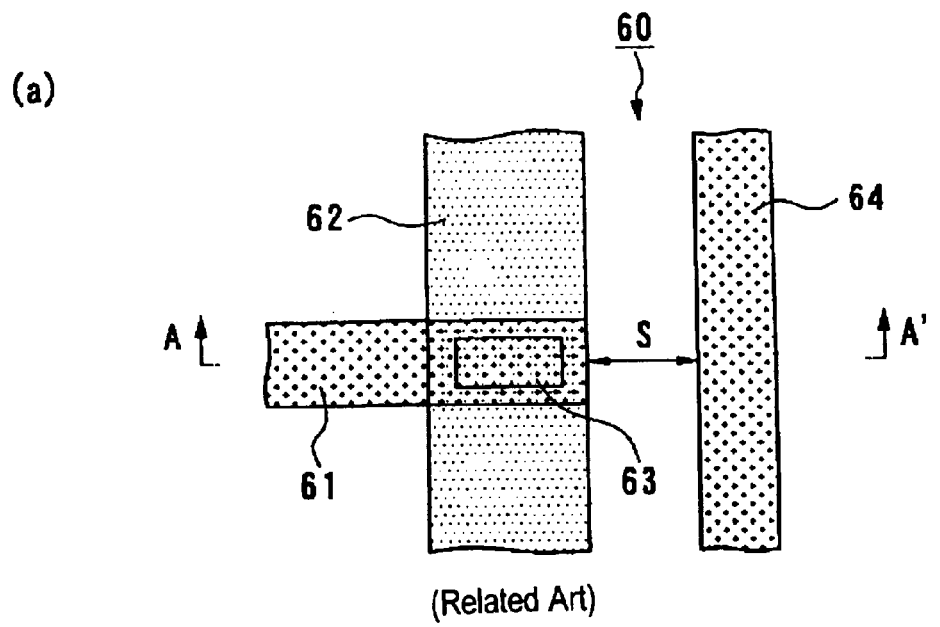
FIGS. 6(a) and 6(b) are views illustrating a related art connecting portion.
Figure 6:
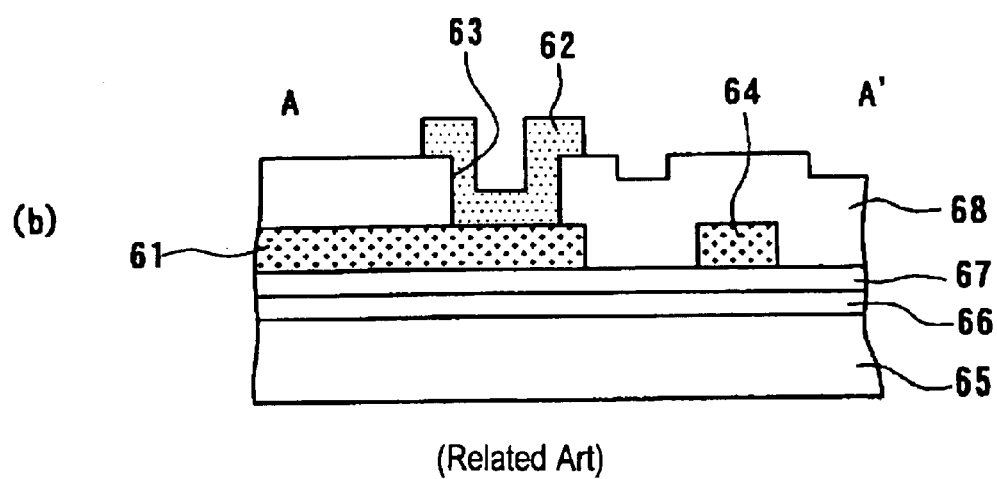

In the liquid crystal display device according to the present exemplary embodiment, it is possible to densely arrange an adjacent pattern by extending the pattern of the contact hole 4 outward from the end of the first conductive layer 2 and arranging the second conductive layer 3 around the adjacent first conductive layer 5. As a result, the circuit of the liquid crystal display device can be highly integrated. For example, although the minimum space between the patterns of a gate layer is S, as in the case of FIG. 6(a), as a result, it is possible to narrow the gap between the second conductive layer 3 and the adjacent first conductive layer 5, compared to the case of FIG. 6(a). It is possible to densely arrange the adjacent pattern by adopting the structure of the connecting portion 1 and thus, to have the circuit of the liquid crystal display device highly integrated.

Further, since the etching stop layer 6, which has a tolerance against etching of the first insulating layer 9, is disposed under the bottom surface of the contact hole 4 on the base insulating film 8, the etching stops when the etchant reaches the etching stop layer 6 during the etching of the first insulating layer 9 and does not proceed further. Therefore, it is possible to reduce or prevent the contact hole 4 from deepening too much, thus reducing or preventing the coverage of the conductive film forming the second conductive layer 3 from deteriorating in the deepest portion of the contact hole 4. As the result, it is possible to reduce or prevent the reliability from deteriorating due to the disconnection of the second conductive layer 3. That is, since the second conductive layer 3 is reliably formed along the internal wall surface of the contact hole 4, it is possible to reduce or prevent the reliability from deteriorating due to the disconnection of the second conductive layer 3.

Second Exemplary Embodiment

Hereinafter, a second exemplary embodiment of the present invention will be described with reference to FIGS. 2(a) and 2(b).

Figure 2:
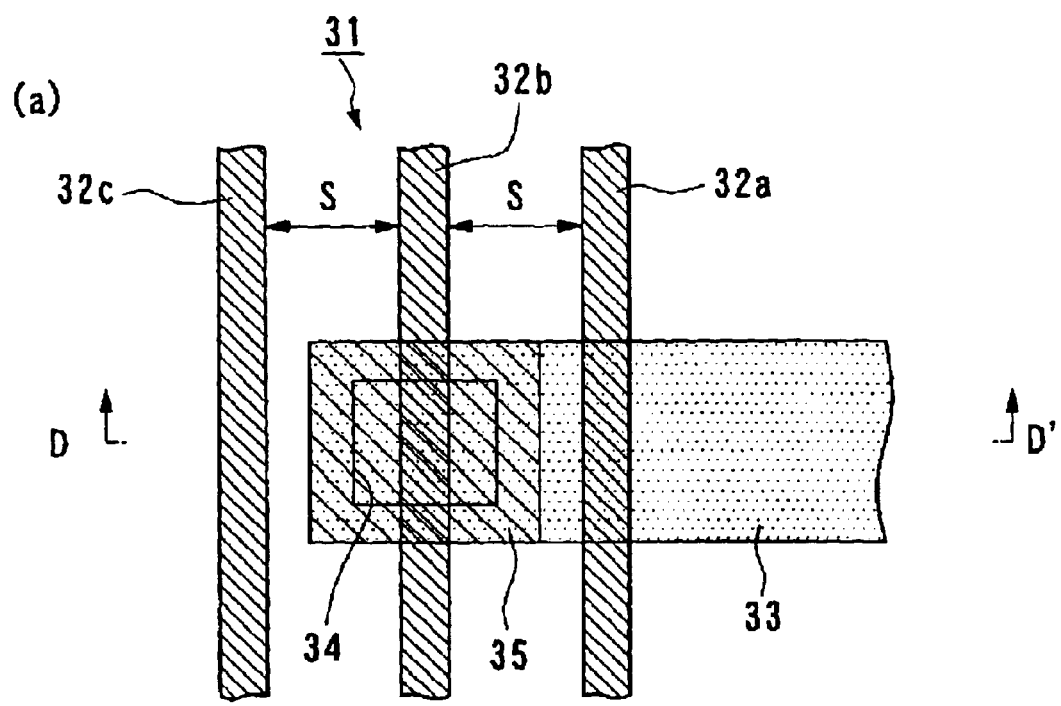
FIGS. 2(a) and 2b) are views illustrating a connecting portion between wiring lines in a liquid crystal display device (an electro-optical device) according to a second exemplary embodiment of the present invention.
Figure 2:
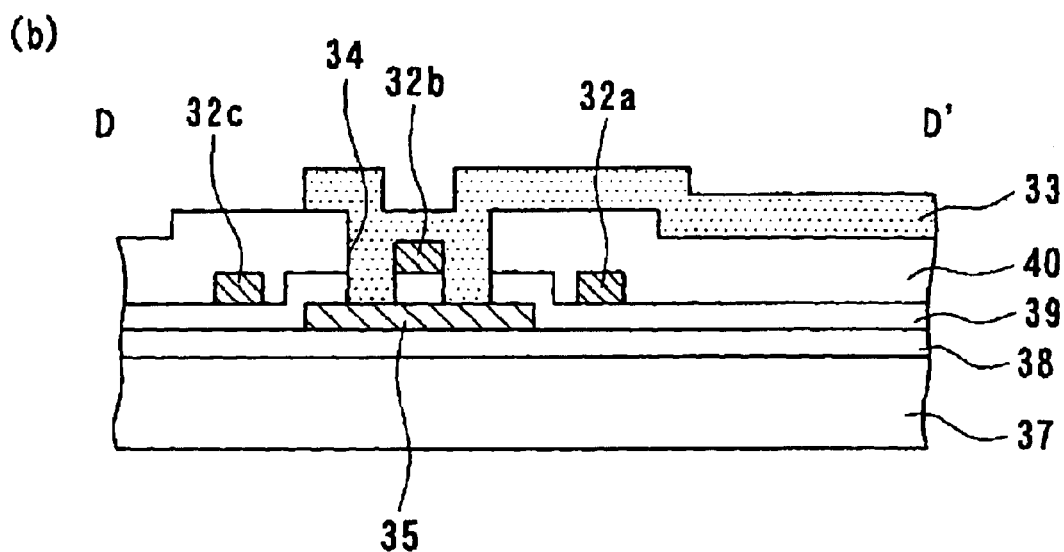

FIG. 2(a) is a plan view illustrating a connecting portion between wiring lines in a liquid crystal display device (an electro-optical device) according to the present exemplary embodiment. FIG. 2(b) is a cross-sectional view taken along the plane D-D' of FIG. 2(a). FIGS. 3(a) and 3(b) are plan views illustrating a conventional connecting portion to explain in comparison to FIG. 2(a). Like the first exemplary embodiment, in the present exemplary embodiment, a liquid crystal display device of the active matrix type, in which a peripheral circuit is included, is used. An example having a conductive film formed of a silicon layer, a first conductive layer, a second conductive layer, and a pixel electrode laminated on the substrate is explained.

In a connecting portion 31 according to the present exemplary embodiment, as illustrated in FIG. 2(a), among three first conductive layers 32a, 32b, and 32c extending substantially parallel to the illustrated vertical direction, a second conductive layer 33 is connected to the central first conductive layer 32b such that the second conductive layer crosses the first conductive layer 32a on the right side. Assuming a liquid crystal display device of the active matrix type, in which a peripheral circuit is included, in an input and output wiring portion for sampling a video signal, the first conductive layers 32a, 32b, and 32c correspond to video signal lines for supplying a video signal, and the second conductive layer 33 corresponds to the wiring line connected to the sampling elements. The number of video signal lines increases according to the number of bits.

Figure 7:
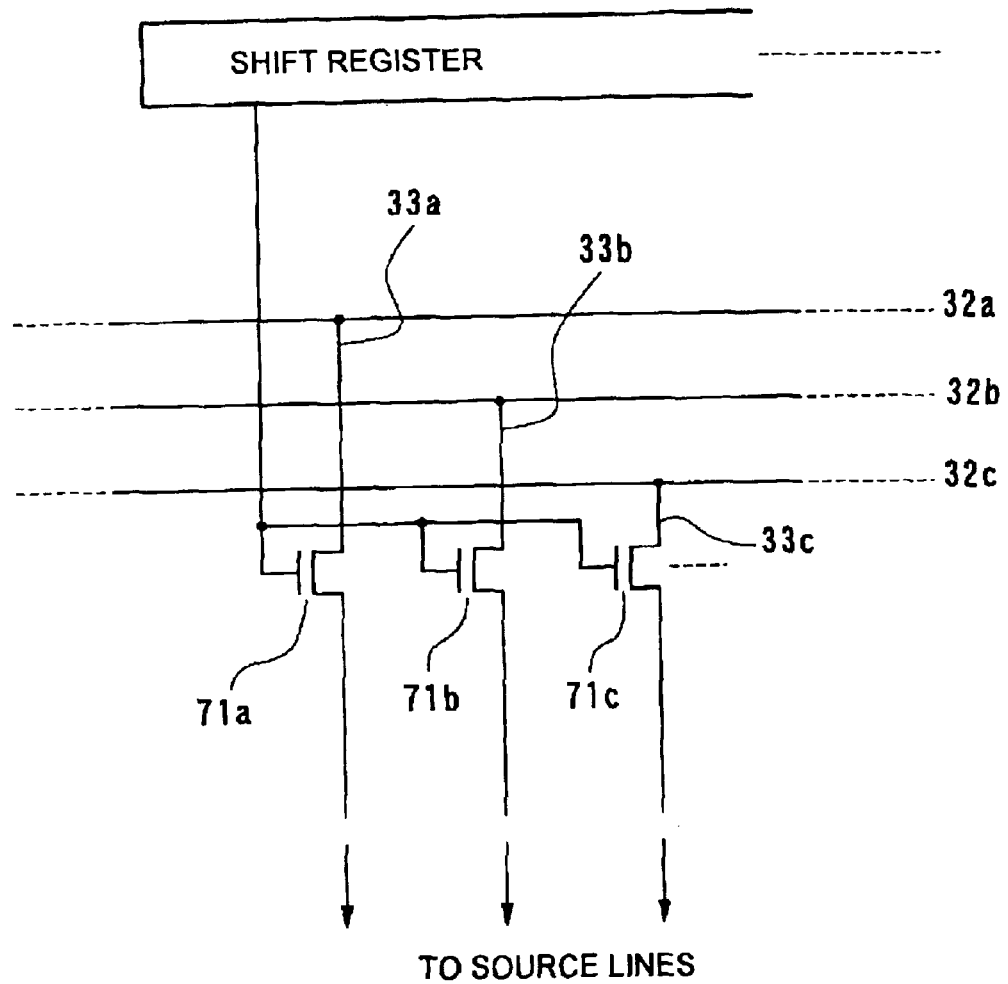
FIG. 7 is a block diagram illustrating an example of a portion where the connecting portion according to the present invention is applied.

For example, FIG. 7 is a block diagram of a case where the number of video signal lines is three and the number of bits is three. The video signal lines 32a, 32b, and 32c are arranged to be substantially parallel to each other. Wiring lines 33a, 33b, and 33c connected to the respective video signal lines are disposed. The wiring lines 33a, 33b, and 33c are connected to source lines through sampling elements 71a, 71b, and 71c, respectively. The present invention is applied to contact portions where the video signal lines 32a, 32b, and 32c are connected to the wiring lines 33a, 33b, and 33c, respectively. The sampling elements 71a, 71b, and 71c are formed of, for example, TFTs.

Here, as illustrated in FIG. 2(a), a case where the number of first conductive layers is three and the second conductive layer 33 is connected only to the central first conductive layer 32b is provided as an example. However, the present invention is not restricted to a case where the number of the first conductive layers is three. The present invention can be applied to a case where the number of video signal lines (the first conductive layers) increases according to the number of bits, as mentioned above, and the second conductive layer is connected to all of the video signal lines.

FIG. 2(a) will be explained again. A contact hole 34 is formed to protrude in both directions of the width of the central first conductive layer 32b. A rectangular etching stop layer 35 is disposed to surround the pattern of the contact hole 34. Further, the second conductive layer 33 is extended to cross the first conductive layer 32a on the right side to overlap the pattern of the etching stop layer 35.

In the sectional structure illustrated in FIG. 2(b), a base insulating film 38 and a first insulating film 39 are sequentially laminated on a substrate 37. The first conductive layers 32a, 32b, and 32c are formed on the first insulating film 39. A second insulating film 40 is formed on the first insulating film 39 to cover the first conductive layers 32a, 32b, and 32c. Further, a contact hole 34 penetrating the second insulating film 40 is formed. The first conductive layer 32b is disposed in part of the bottom surface of the contact hole 34. The second conductive layer 33 is formed along the internal wall surface of the contact hole 34. The wiring lines are electrically connected to each other by contacting the second conductive layer 33 to the first conductive layer 32b. Further, an etching stop layer 35 is formed on the bottom surface of the contact hole 34 on the base insulating film 38. The etching stop layer 35 has a high etching selection ratio for the first insulating film 39 and a sufficiently large tolerance against etching of the first insulating film 39. That is, in FIG. 2(b) according to the present exemplary embodiment, unlike in FIG. 1(b) according to the first exemplary embodiment, the first insulating film 39 is entirely etched in the contact hole 34.

Further, the materials illustrated in the first exemplary embodiment can be used as the specific construction materials of the respective layers. The order of forming the connecting portion 31 of the above structure is the same as the order of forming the connecting portion according to the first exemplary embodiment.

Figure 3:
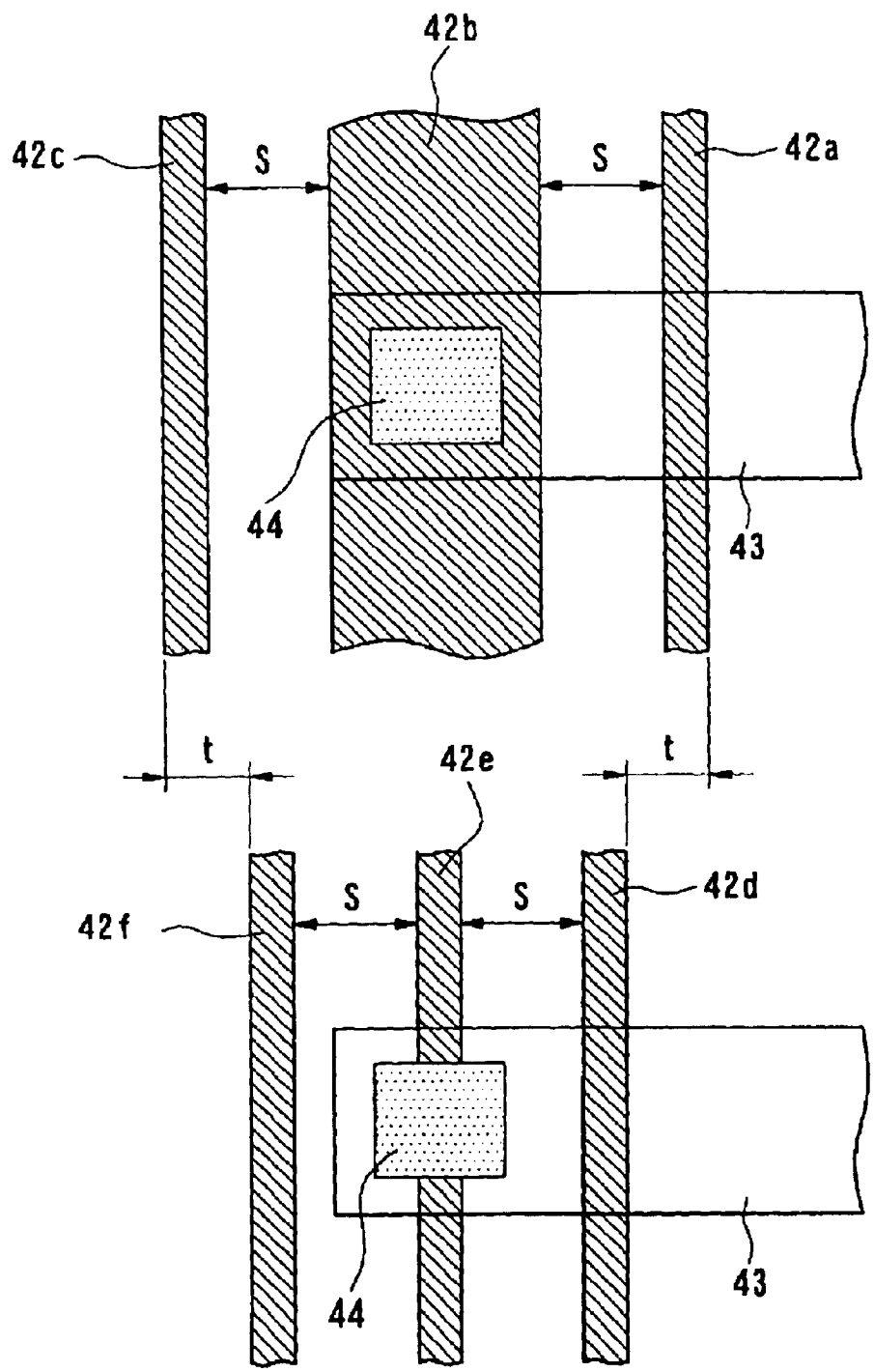
FIG. 3 is a plan view illustrating the structure of a related art connecting portion to explain the effect of the connecting portion when highly integrated.

Thus, in the case of designing a connecting portion where another first conductive layer crosses one first conductive layer and is connected to the second conductive layer, in the conventional structure, as illustrated in the upper part of FIG. 3, a contact hole 44 is completely disposed on the first conductive layer 42b. On the other hand, as illustrated in the lower part of FIG. 3, when the contact hole 44 protrudes in both directions of the first conductive layer 42e by reducing the line width of the first conductive layer 42e, in which the connecting portion is disposed, it is possible to make both first conductive layers 42d and 42f approach the central first conductive layer 42e by t, with the minimum space between the patterns of a gate layer being the rule S.

Therefore, it is possible to densely arrange the adjacent pattern compared to the structure in the upper part of FIG. 3. As a result, the circuit of the liquid crystal display device can be highly integrated. The connecting portion 31 according to the present exemplary embodiment basically adopts the structure in the lower part of FIG. 3. Therefore, it is possible to obtain the advantage of having the circuit highly integrated.

At the same time, since the etching stop layer 35, which has a tolerance against etching of the first insulating film 39, is disposed in the region corresponding to the bottom surface of the contact hole 34, the etching stops when the etchant reaches the etching stop layer 35 during the etching of the first insulating film 39 and does not proceed further. Thus, since the contact hole 34 does not deepen too much and the second conductive layer 33 is reliably formed along the internal wall surface of the contact hole, it is possible to reduce or prevent the reliability from deteriorating due to the disconnection of the second conductive layer 33. As mentioned above, for example, when the present invention is applied to the input and output wiring portion for sampling a video signal of the liquid crystal display device of the active matrix type, in which the peripheral circuit is included, it is possible to obtain a larger effect of having the circuit highly integrated.

Overall Structure of Liquid Crystal Display Device

Figure 4:
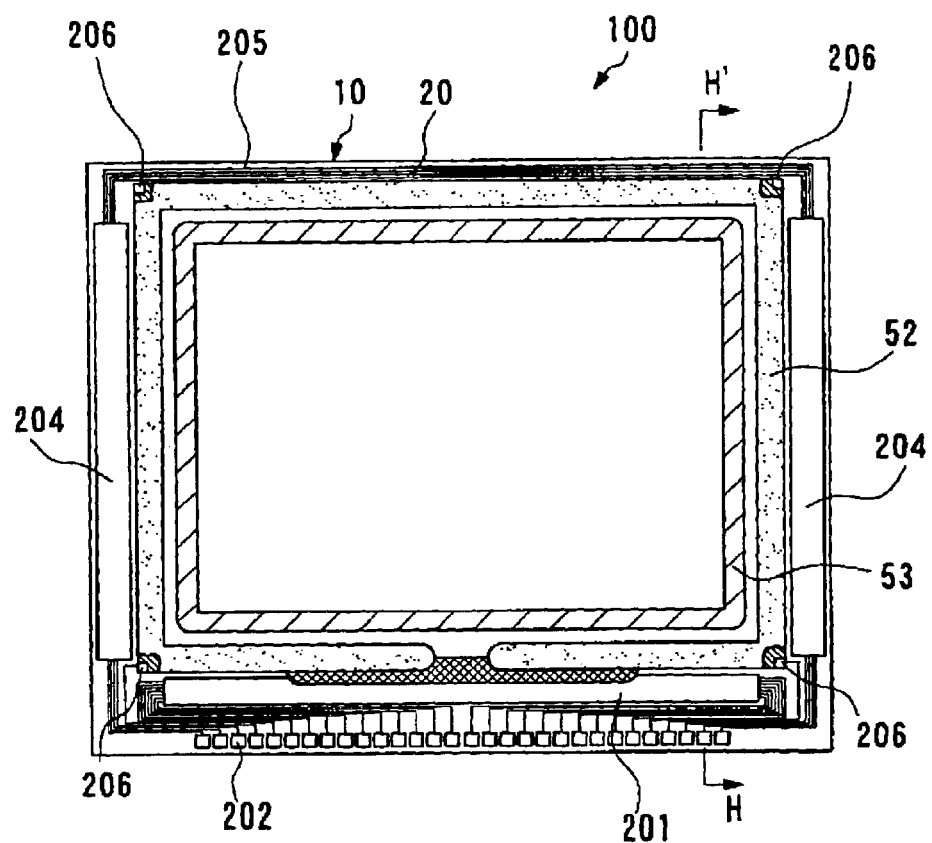
FIG. 4 is a plan view illustrating the overall structure of the liquid crystal display device.
Figure 5:
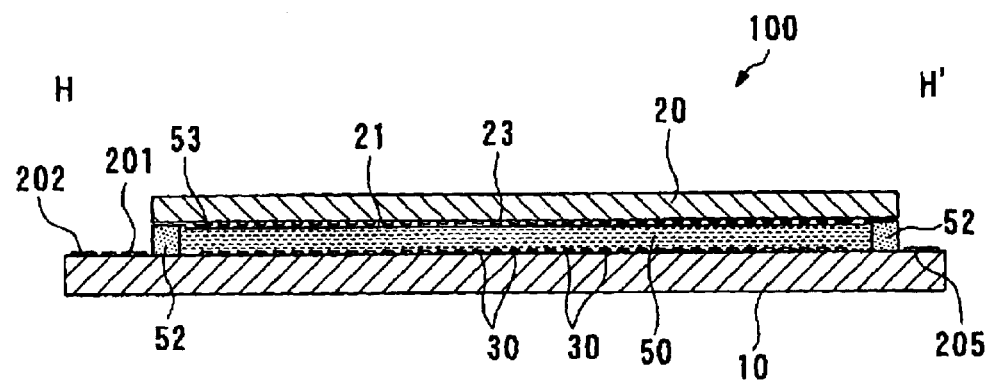
FIG. 5 is a cross-sectional view taken along the plane H-H' of FIG. 4.

In a liquid crystal display device 100 according to the present exemplary embodiment, as illustrated in FIGS. 4 and 5, a TFT array substrate 10 and a counter substrate 20 are bonded to each other by a sealing material 52, and liquid crystal 50 is sealed and held in the region bordered by the sealing material 52. A light shielding film (a peripheral partition) 53 formed of a light shielding material is formed inside the region where the sealing material 52 is formed. In the region outside the sealing material 52, a data line driving circuit 201 and external-circuit connecting terminals 202 are formed along one side of the TFT array substrate 10, and scanning line-driving circuits 204 are formed along two sides adjacent to that side. A plurality of wiring lines 205 for connecting to each other the two scanning line driving circuits 204 disposed on both sides of an image display region is disposed on the remaining side of the TFT array substrate 10. Further, a conductive material 206 for obtaining electrical conduction between the TFT array substrate 10 and the counter substrate 20 is arranged between the substrates in at least one part of the corner portions of the counter substrate 20.

The connecting portions 1 and 31 according to the above embodiments are mainly used for peripheral circuits such as the data line driving circuit 201 and the scanning line driving circuits 204. For example, when a circuit such as a DAC (Digital Analog Converter) is included in the peripheral circuits, in the input and output wiring portions of latches to sample digital data of the peripheral circuits, as the number of bits increases, the number of contact holes of the second conductive layer and the first conductive layer significantly increases and the area occupied by the input and output wiring portion increases. Further, when efforts are made to prevent the area from increasing, there is no room for arranging contacts. In that respect, according to the present invention, efforts are made to have each connecting portion highly integrated, as mentioned above. As a result, because it is possible to minimize the peripheral circuits all over the liquid crystal display device, it is possible to reduce the size of the frame by reducing the size of the peripheral region other than the display region.

Further, the technical scope of the present invention is not restricted to the above exemplary embodiments. Various modifications can be made without departing from the spirit and scope of the invention. For example, according to the first and second exemplary embodiments, in the connecting portion for connecting a lower layer, that is, the first conductive layer to an upper layer, that is, the second conductive layer, a silicon layer in a layer lower than the first conductive layer is used as the etching stop layer. Instead of the example, for example, in the formation of the same layer, in the case of the connecting portion for connecting the lower layer, that is, the second conductive layer to the upper layer, that is, the pixel electrode, the first conductive layer in a portion lower than the second conductive layer may be used as the etching stop layer.

Furthermore, the structure of the present invention can be realized using various layers. Also, in the aforementioned description, the electro-optical device represented by the liquid crystal display device is provided as an example, but the present invention is not restricted to liquid crystal display devices and can be applied to all electro-optical devices, such as display devices provided with EL elements, or semiconductor devices.

As mentioned above, according to the present invention, it is possible to densely arrange the adjacent pattern in various circuits forming an electro-optical device or a semiconductor device. As a result, the circuits of the electro-optical device or the semiconductor device can be highly integrated. Also, since the contact hole of the connecting portion does not deepen too much and the conductive layer is reliably formed along the internal wall surface of the contact hole, it is possible to reduce or prevent the reliability from deteriorating.

What is claimed is:

1. An electro-optical device including an electro-optical material, comprising:

a substrate;

a first insulating layer;

a first conductive layer formed on the first insulating layer, a second insulating layer formed to cover the first conductive layer, a second conductive layer formed on the second insulating layer;

a contact hole at least penetrating the second insulating layer;

at least one connecting portion facilitating highly integrated arrangement of elements on the substrate where the first conductive layer and the second conductive layer are electrically connected to each other because the first conductive layer contacts the second conductive layer in part of the side surface or the bottom surface of the contact hole with less than full overlap between the first conductive layer and the second conductive layer providing for dense arrangement of other connecting portions on the substrate; and an etching stop layer that is electrically floating and has a tolerance against etching of the first insulating layer being disposed at least in a region under the bottom surface of the contact hole.

2. The electro-optical device according to claim 1, the etching stop layer being formed of one of a conductive film and a semiconductor film.

3. The electro-optical device according to claim 2, the conductive film or the semiconductor film being electrically insulated from other elements or wiring lines.

4. The electro-optical device according to claim 1, two dimensionally, a pattern of the contact hole protrudes outward from a pattern of the first conductive layer, and an other pattern in the same layer as the first conductive layer is arranged at the side where the pattern of the contact hole protrudes.

5. A semiconductor device comprising:

a substrate;

a first insulating layer;

a first conductive layer formed on the first insulating layer, a second insulating layer formed to cover the first conductive layer;

a second conductive layer formed on the second insulating layer, a contact hole at least penetrating the second insulating layer;

at least one connecting portion facilitating highly integrated arrangement of elements on the substrate where the first conductive layer and the second conductive layer are electrically connected to each other because the first conductive layer contacts the second conductive layer in part of the side surface or the bottom surface of the contact hole with less than full overlap between the first conductive layer and the second conductive layer providing for dense arrangement of other connecting portions on the substrate; and an etching stop layer that is electrically floating and has a tolerance against etching of the first insulating layer being disposed at least in a region under the bottom surface of the contact hole.

6. The semiconductor device according to claim 5, the etching stop layer being formed of one of a conductive film and a semiconductor film.

7. The semiconductor device according to claim 6, the conductive film or the semiconductor film being electrically insulated from other elements or wiring lines.

8. The semiconductor device according to claim 5, two-dimensionally, a pattern of the contact hole protruding outward from a pattern of the first conductive layer, and an other pattern in the same layer as the first conductive layer is arranged at the side where the pattern of the contact hole protrudes.

* * * * *